United States Patent [19]
Chang

[11] Patent Number: 6,015,995
[45] Date of Patent: Jan. 18, 2000

[54] ROM DIODE STRUCTURE

[75] Inventor: Kuang-Yeh Chang, Taipei, Taiwan

[73] Assignee: United Microelectronics Corp., Taiwan

[21] Appl. No.: 09/031,818

[22] Filed: Feb. 27, 1998

Related U.S. Application Data

[62] Division of application No. 08/808,258, Feb. 28, 1997, Pat. No. 5,891,777.

[30] Foreign Application Priority Data

Nov. 22, 1996 [TW] Taiwan ................................. 85114443

[51] Int. Cl.[7] ........................... H01L 29/76; H01L 29/861
[52] U.S. Cl. ............................................. 257/390; 257/910
[58] Field of Search .................................. 257/321, 329, 257/231, 390, 910; 438/390, 237, 275

[56] References Cited

U.S. PATENT DOCUMENTS 5,441,907  8/1995  Sung et al. ................................ 438/237
5,654,225  8/1997  Zambrano ................................ 438/138

*Primary Examiner*—Wael Fahmy
*Assistant Examiner*—William David Coleman
*Attorney, Agent, or Firm*—Rabin & Champagne, PC

[57] ABSTRACT

A read only memory device, which includes a P-type substrate, is provided. Several essentially parallel N-pole regions are located on the substrate. The N-pole regions extends in a first direction, and are separated from each other by a space. The N-pole regions form bit lines. Several N-type diffusion regions are located under selected portions of respective N-pole regions. Several P-type diffusion regions are located over respective selected portions of the N-pole regions. Each respective P-type diffusion region and associated N-pole region forms a diode. Several essentially parallel word lines extend in a second direction. Each word line is separated from an adjacent word line by a space. Each of the word lines is coupled to each of the corresponding P-type diffusion regions.

5 Claims, 4 Drawing Sheets

ROM DIODE STRUCTURE

This is a Division of application Ser. No. 08/808,258, filed Feb. 28, 1997 now U.S. Pat. No. 5,891,777.

BACKGROUND OF THE INVENTION

1. Field of the Invention

The invention relates in general to a read only memory (ROM) diode and a method of making the same. More particularly, the present invention relates to a ROM that uses a diode as a memory cell, and a method of making such a memory cell.

2. Description of the Related Art

Read only memory is widely used in mini computers, micro processors and other digital hardware. A ROM can be used to store system information, for example, basic input/output system (BIOS) information. However, ROM devices are difficult to manufacture and the various manufacturing and pretreatment steps are time consuming. Therefore, customers typically deliver programming data to the factory that makes the ROM devices, which then programs the ROM device to complete the product.

Because ROM devices typically have similar structures (with the exception of the data which is stored in the ROM device during the programming step), in most integrated circuit (IC) factories a ROM is produced without performing the programming steps, and is stored. After receiving the program from the customer, a mask is produced so that the necessary programming step can be performed and production finished, thus reducing the lead time and thereby providing better customer service. Therefore, a ROM that is post-programmed using a mask is commonly used in the art.

Channel transistors are normally used as memory cells for ROM. In the programming process, specific channel regions of the channel transistors are selectively implanted with impurities, thus modifying the threshold voltages of the transistors. This controls the conductivity of the memory cell. A detailed description of a conventional ROM structure is as follows, with reference to FIG. 1A through FIG. 1C. FIG. 1A is a top, partial view of a conventional ROM. FIG. 1B is a front, partial view of the conventional ROM. FIG. 1C is a cross-sectional view of the ROM. The conventional ROM includes a substrate 10, a plurality of bit lines 11 (BL), an oxide layer 12, and a plurality of word lines 13. The substrate 10 is, for example, a P-type substrate. The bit lines 11, oxide layer 12, and word lines 13 are formed on the substrate 10. As shown in FIG. 1A, the region surrounded by the dotted line forms a memory cell 14. Data in binary form, such as "0" or "1", is stored in the memory cell by implantation of a channel 16 (FIG. 1c).

Referring also to FIG. 1C, an N-type implantation is performed using, for example, arsenic ions to form bit lines 11, with the bit lines 11 being arranged with an equal distance between each other. Channel 16 is formed between adjacent bit lines 11. Next, oxide layer 12 is formed on the surface of bit lines 11 and channel 16 using an oxidation process. A conductive layer, for example, a layer of heavy doped polysilicon, is formed over the substrate 10. Using photolithography and etching processes, word lines 13 (which cross bit lines 11) are formed from the conductive layer. Next, channel transistors are formed to complete the manufacture of a conventional ROM (with the exception of programming processing). Next, a series of continuous programming steps is performed. A mask 15 is formed over the ROM to expose the portions of channel 16 which are to be encoded. Then, a P-type implantation is performed using, for example, boron ions to implant a code. However, the type of the implanted impurity is selected depending on the characteristics of the transistor.

Channel transistors are typically used as memory cells in the conventional ROM described above. As is well known, the process of making the channel transistor is complex. Because a metal-oxide-semiconductor transistor is difficult to minimize, the integration of devices can not be effectively performed. Further, in the manufacturing of the conventional ROM, the bit lines are formed using N-type implantation. Because the resistance of the bit lines is about 100 ohm per square, operating current cannot be increased. Further, because of the lower breakdown voltage of the channel transistor, the decoding operating voltage is limited. These limitations may result in an output error.

SUMMARY OF THE INVENTION

It is therefore an object of the present invention to provide an improved ROM structure and a method of making the same. The invention replaces the channel transistor, which is used as the memory cell of a ROM, with a diode. This simplifies the manufacturing process and reduces the manufacturing time.

Further, it is an object of the present invention to reduce resistance, increase operating current and operating voltage, and provide a higher breakdown voltage of the memory cell.

Moreover, it is an object of the present invention to provide a diode as a memory cell to reduce the size of the ROM, and increase the integratability of the ROM into other devices.

The invention achieves the above-identified objects by providing a new method of making a diode ROM. The method includes forming a pad oxide layer on a P-type substrate. A silicon nitride layer is formed on an upper surface of the pad oxide layer. The silicon nitride layer is patterned to define a plurality of active regions. A field oxide layer is formed over an upper surface of the substrate. The silicon nitride layer is removed. The P-type substrate is doped using first N-type ions to form a plurality of essentially parallel N-pole regions extending in a first direction. Each N-pole region is separated from an adjacent N-pole region by a space. An insulating layer is formed over the field oxide layer. The insulating layer is patterned, and a plurality of contact windows are formed within the insulating layer to expose a portion of the N-pole regions. The P-type substrate is doped using second N-type ions, and the doped P-type substrate is annealed, to form a plurality of N-type diffusion regions under the exposed portions of the N-pole regions. The N-pole regions are doped using P-type ions, and the doped N-pole regions are annealed, to form a plurality of P-type diffusion regions above the N-type diffusion regions and in the exposed portions of the N-pole regions. A metal layer is formed over the insulating layer and fills the contact windows. The metal layer is patterned to form a plurality of essentially parallel word lines extending in a second direction that intersects the first direction at an angle. Each word line is separated from an adjacent word line by a space. The present invention is also directed toward a read only memory device, that includes a P-type substrate. A plurality of essentially parallel N-pole regions are located on the substrate. The N-pole regions extend in a first direction, and are separated from each other by a space. The N-pole regions form bit lines. A plurality of N-type diffusion regions are located under selected portions of respective N-pole regions. A plurality of P-type diffusion regions are located over respective selected portions of the N-pole regions. Each respective P-type diffusion region and associated N-pole region forms a diode. A plurality of essentially parallel word lines extend in a second direction. Each word line is separated from an adjacent word line by a space. Each of the word lines is coupled to each of the corresponding P-type diffusion regions.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

Figure 1A:
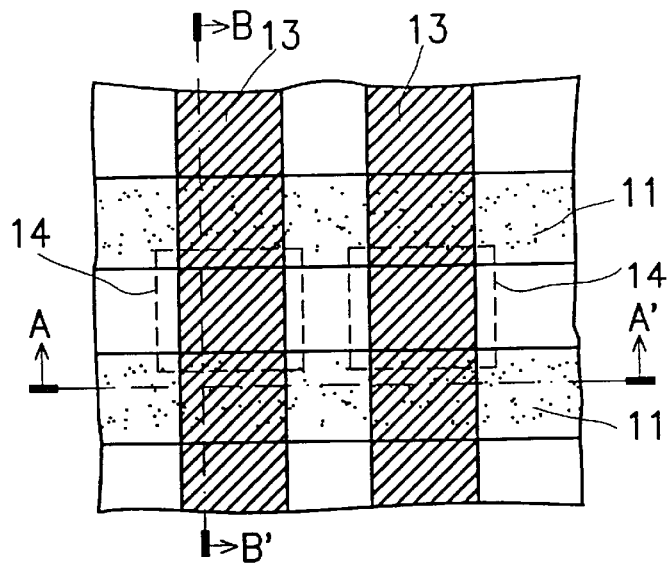
FIG. 1A is a top view of a conventional ROM.
Figure 1B:
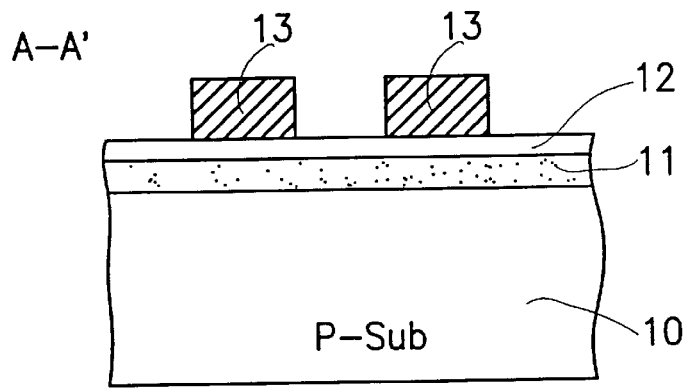
FIG. 1B is a front, cross-sectional view of a conventional ROM.
Figure 1C:
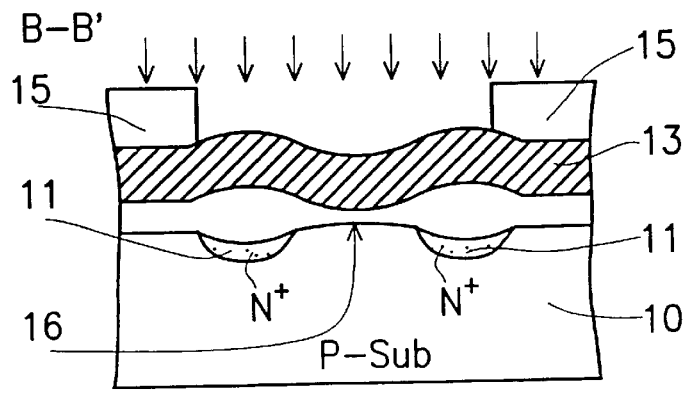
FIG. 1C is a side, cross-sectional view of a conventional ROM.
Figure 2A:
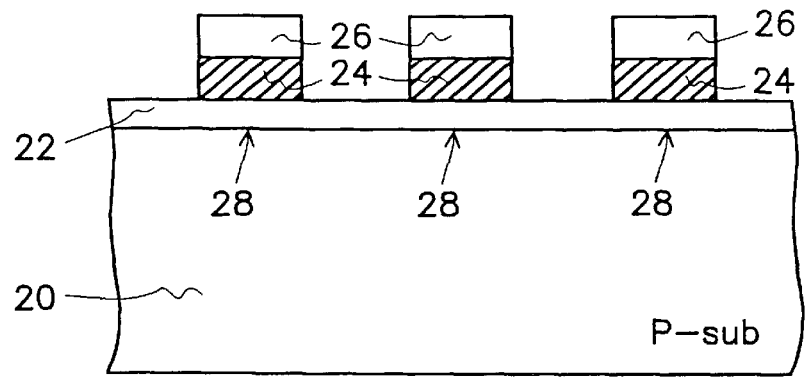
FIGS. 2A to 2E are cross-sectional views of a ROM diode taken during various sequential process steps according to one preferred embodiment of the present invention.

Referring to FIG. 2A, a P-type substrate 20 is provided. A pad oxide layer 22 and a silicon nitride layer 24 are formed over the upper surface of the substrate 20, respectively. A photoresist 26 is spin-coated over the substrate 20, and patterned using photolithography techniques to expose a portion of the silicon nitride layer 24. The exposed portion of the silicon nitride layer 24 is stripped using etching, for example dry etching, to define active regions 28. The active regions 28 are covered by the remaining portions of the silicon nitride layer 24.

Figure 2B:
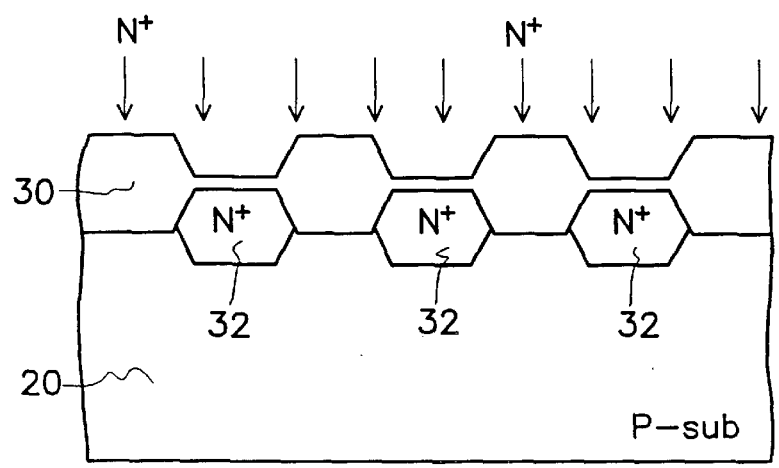

Referring to FIG. 2B, a field oxide layer 30 is formed on the upper surface of the substrate 20 using wet oxidation. Then, silicon nitride layer 24 is stripped. Using the field oxide layer 30 as a mask, an N-type implantation is performed using, for example, arsenic at a dosage between about $10^{15}$ and about $10^{16}$ atoms/cm$^2$ and at an energy between about 40 and about 80 KeV. The N-type implantation forms a plurality of parallel N-pole regions 32. Every two adjacent N-pole regions 32 have essentially the same distance therebetween. The N-pole regions 32 form bit lines of a ROM.

Figure 2C:
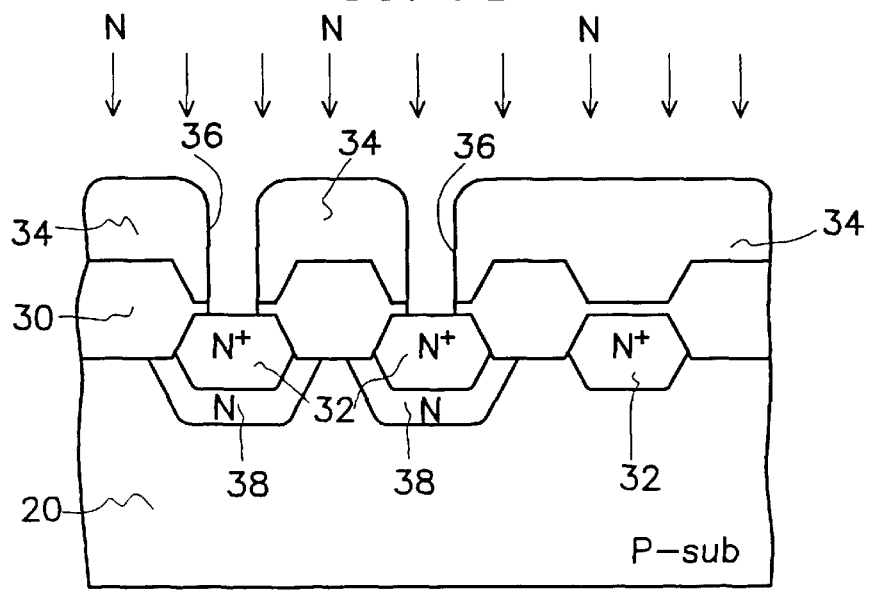

Referring to FIG. 2C, an insulating layer 34, for example a planarized insulating layer, is formed over the field oxide layer 30. The insulating layer 34 is preferably comprised of a borophosilicate glass (BPSG) layer. The insulating layer 34 is patterned to form a plurality of contact windows 36 at specific locations, which exposes a portion of the N-pole regions 32. Using the insulating layer 34 as a mask, implantation is performed using, for example, phosphorus at a dosage of between about $10^{14}$ and about $10^{15}$ atoms/cm$^2$, and at an energy of between about 40 and about 120 KeV. Then, annealing, for example, rapid thermal processing (RTP), is performed to form a number of N-type diffusion regions 38 under the exposed portions of the N-pole regions 32. The N-type diffusion regions 38 are more lightly doped than the N-pole regions 32.

Figure 2D:
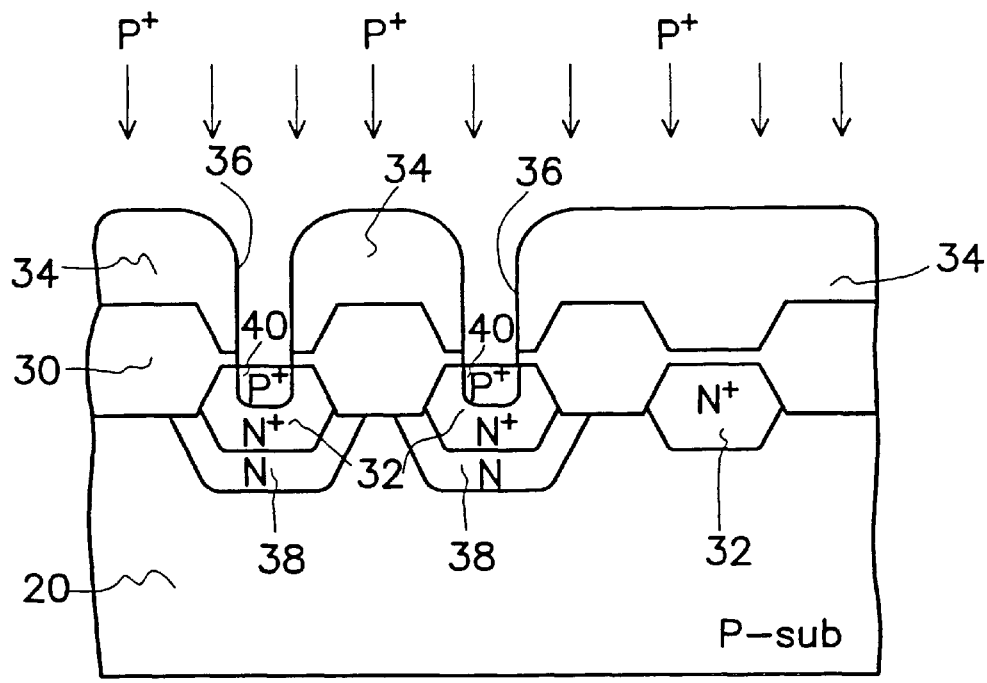

Referring to FIG. 2D, a diode is formed. Using the insulating layer 34 as a mask, a P-type implantation is performed in the contact windows 36 using, for example, boron at a dosage of about $10^{16}$ atoms/cm$^2$ and at an energy of between about 25 and about 40 KeV. Then annealing, for example, rapid thermal processing (RTP), is performed to form a plurality of P-type diffusion regions 40 over the upper surface of the substrate 20 and within respective N-pole regions 32. Therefore, a selected N-pole region 32 is combined with a respective P-type diffusion region 40 to form a diode. Because the lightly-doped N-type diffusion regions 38 were previously formed under the N-pole regions 32, current leakage induced by the electrical conduction of the P-type substrate 20 and the N-pole regions 32, will not occur.

Figure 2E:
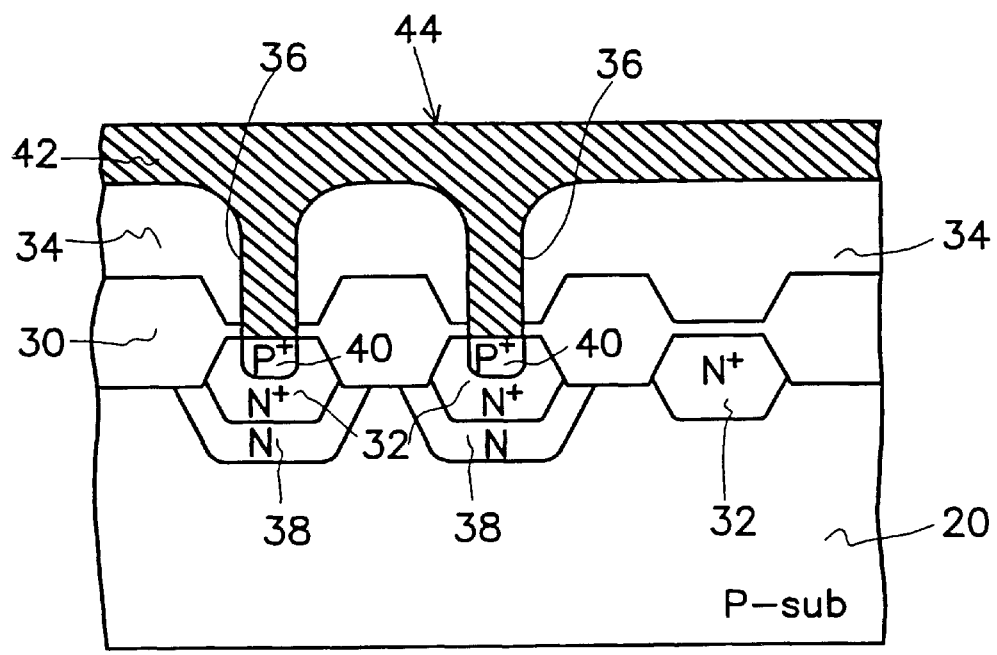

Referring to FIG. 2E, a metal layer 42, for example, aluminum (Al), is formed over the insulating layer 34 and fills the contact windows 36. The metal layer 42 is patterned to form a plurality of parallel word lines 44 each of which is spaced from an adjacent word line 44 by an essentially equal distance. The N-pole regions 32 extend in a direction that intersects the word lines 44 at an angle, for example, about 90°. Thus, the forming of a memory cell of a ROM according to the present invention is complete.

Referring again to FIG. 2D, the N-type diffusion regions 38 and the P-type diffusion regions 40 of this embodiment are small. In order to reduce current leakage without increasing manufacturing costs, a modified memory cell is proposed. The modified memory cell is based on the structure shown in FIG. 2B.

Figure 2F:
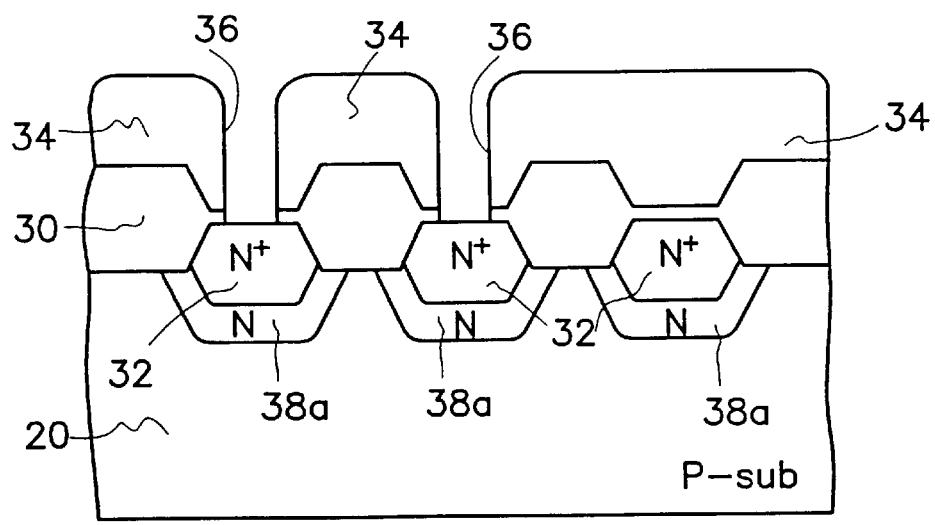
FIG. 2F is a cross-sectional view of a ROM diode showing a further process step according to the present invention.

Referring to FIG. 2F, after the N-pole regions 32 are formed, and using field oxide layer 30 as a mask, implantation is performed using the same type ions as the dopant of the N-pole regions 32, for example, phosphorus at a dosage of between about $10^{14}$ and about $10^{15}$ atoms/cm$^2$, and at an energy of between about 40 and about 120 KeV. Then annealing, for example, rapid thermal processing (RTP), is performed to form a plurality of N-type diffusion regions 38a under the N-pole regions 32. N-type diffusion regions 38a are arranged in a ribbon-like pattern similar to the N-pole regions 32. The N-type diffusion regions 38a are more lightly doped than the N-pole regions 32. An insulating layer 34, for example, a planarized insulating layer, is formed over the field oxide layer 30. The insulating layer 34 is preferably comprised of a borophosphosilicate glass (BPSG) layer. Insulating layer 34 is patterned to form a plurality of contact windows 36 at specific locations, which exposes a portion of the N-pole regions 32. This forms the modified structure shown in FIG. 2F, which replaces the structure shown in FIG. 2C. The successive processes of forming the ROM diode memory cell are substantially the same as those shown in FIG. 2D through FIG. 2E, and as described in the related paragraphs.

Figure 3:
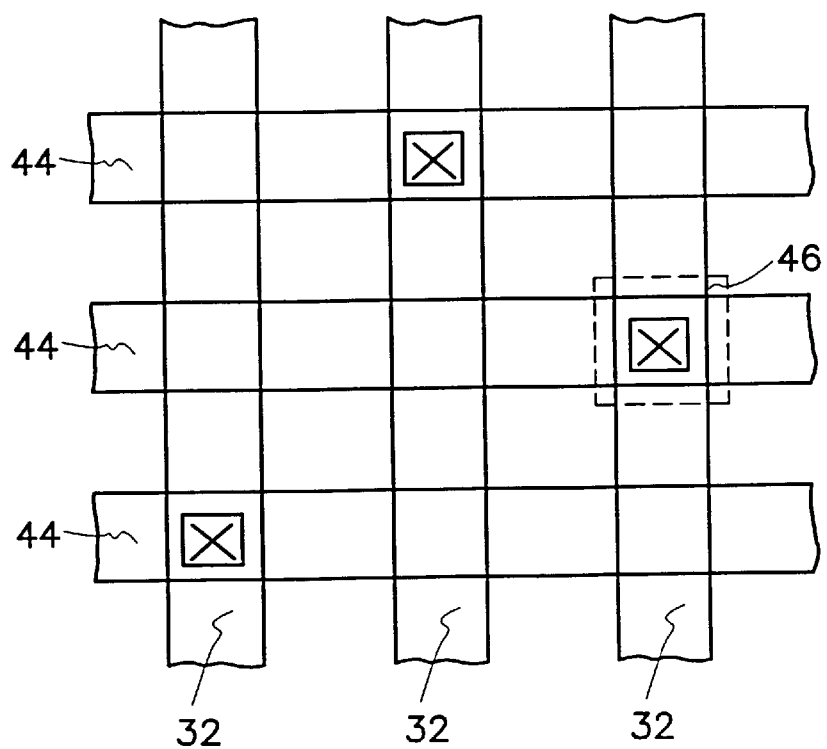
FIG. 3 is a top view of a high density ROM according to a preferred embodiment of the invention.

A top view of a ROM according to a preferred embodiment is shown in FIG. 3. The region where the N-pole region 32 and the word line 44 intersect forms a memory cell 46, as shown by the dotted line region in FIG. 3. The memory cells having a P-type diffusion region comprises a "turned-on" memory cell, as shown by the X in FIG. 3. The memory cell without a P-type diffusion region comprises a "turned-off" memory cell. While the invention has been described by way of example and in terms of preferred embodiments, it is to be understood that the invention is not limited thereto. To the contrary, it is intended to cover various modifications and similar arrangements and procedures as would be apparent to those skilled in the art. Therefore, the scope of the appended claims, which define the invention, should be accorded the broadest interpretation so as to encompass all such modifications and similar arrangements and procedures.

What is claimed is:

1. A read only memory device, comprising:

a P-type substrate;

a plurality of essentially parallel N-pole regions located on the substrate, said N-pole regions extending in a first direction, and being separated from each other by a space, said N-pole regions forming bit lines;

a plurality of N-type diffusion regions located in the substrate, each underlying a respective selected N-pole region so that each respective selected N-pole region is completely isolated from the substrate by the respective underlying N-type diffusion region to prevent current leakage;

a plurality of P-type diffusion regions, each being located within a respective one of the selected N-pole regions so that each P-type diffusion region is surrounded by the respective one of the selected N-pole regions to isolate the P-type diffusion region from the respective underlying N-type diffusion region, each respective P-type diffusion region and each respective selected N-pole region together forming one of a plurality of diodes;

a field oxide region disposed between adjacent ones of the diodes to separate the diodes from each other; and a plurality of essentially parallel word lines extending in a second direction, each of said word lines being coupled to the respective P-type diffusion region.

2. A structure according to claim 1, wherein said word lines comprise aluminum.

3. A structure according to claim 1, wherein the first direction intersects the second direction at an essentially perpendicular angle.

4. A structure according to claim 1, wherein each N-type diffusion region forms a ribbon that extends under, and essentially parallel to, a respective N-pole region.

5. A structure according to claim 1, wherein each said N-type diffusion region is in registration with a respective P-type diffusion region.

* * * * *